(12) United States Patent
Kawada (10) Patent No.: US 8,329,591 B2
(45) Date of Patent: Dec. 11, 2012

(54) METHOD OF MANUFACTURING A SEMICONDUCTOR DEVICE

(75) Inventor: Shinji Kawada, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 910 days.

(21) Appl. No.: 12/101,334

(22) Filed: Apr. 11, 2008

(65) Prior Publication Data

US 2008/0268648 A1   Oct. 30, 2008

(30) Foreign Application Priority Data

Apr. 27, 2007   (JP) ................................. 2007-118478

(51) Int. Cl.
*H01L 21/3065* (2006.01)
(52) U.S. Cl. ........ 438/714; 438/715; 438/733; 438/706; 438/710; 216/72; 216/17; 216/67; 257/E21.218
(58) Field of Classification Search .................. 438/714, 438/715, 622, 668, 733, 734, 735, 706, 710; 216/67, 70, 72, 17; 156/345.37; 257/E21.218
See application file for complete search history.

(56) References Cited

U.S. PATENT DOCUMENTS

| | | | | |
|---|---|---|---|---|
| 5,865,900 A | * | 2/1999 | Lee et al. ........................ | 134/1.2 |
| 6,162,677 A | * | 12/2000 | Miyakawa et al. ............. | 438/253 |
| 6,436,838 B1 | * | 8/2002 | Ying et al. ...................... | 438/710 |
| 2003/0181031 A1 | * | 9/2003 | Kojima et al. .................. | 438/627 |
| 2003/0186545 A1 | * | 10/2003 | Kamp et al. .................... | 438/689 |
| 2004/0198062 A1 | * | 10/2004 | Ye et al. .......................... | 438/706 |
| 2006/0213616 A1 | * | 9/2006 | Ogasawara ............... | 156/345.24 |

FOREIGN PATENT DOCUMENTS

JP   2003-282571   10/2003

* cited by examiner

*Primary Examiner* — Lan Vinh
*Assistant Examiner* — David Kaufman
(74) *Attorney, Agent, or Firm* — Taft Stettinius & Hollister LLP (57) ABSTRACT

Disclosed is a means for stabilizing quality of a semiconductor device by preventing projections from being formed in the bottom of a through hole. A method of manufacturing a semiconductor device includes a process of forming a through hole reaching a metal nitride layer through an interlayer insulating layer on a semiconductor wafer on which the wiring layer, the metal nitride layer formed on the wiring layer, and the interlayer insulating layer covering the wiring layer and the metal nitride layer are formed. The through hole forming process includes: a first etching step of etching the interlayer insulating layer by an anisotropic etching method with the semiconductor wafer set to a first temperature; and a second etching step of etching an upper surface of metal nitride layer by an anisotropic etching method with the semiconductor wafer set to a second temperature higher than the first temperature.

11 Claims, 6 Drawing Sheets

METHOD OF MANUFACTURING A SEMICONDUCTOR DEVICE

CROSS-REFERENCE TO RELATED APPLICATIONS

This application is a claims priority under 35 U.S.C. §119 to Japanese Patent Application Serial No. JP2007-118478 filed on Apr. 27, 2007, entitled "METHOD OF MANUFACTURING SEMICONDUCTOR DEVICE," the disclosure of which is hereby incorporated by reference.

RELATED ART

1. Field of the Invention

The present invention relates to methods of manufacturing semiconductor devices and manufacturing methods that utilize etching to form holes through respective layers.

2. Brief Discussion of Related Art

Conventional semiconductor device manufacturing methods form holes through an insulating layer to expose a titanium nitride layer interposing the insulating layer and an underlying wiring layer by forming a resist mask that includes openings to expose selected portions of the underlying insulating layer. Thereafter, the resist mask is subjected to a reactive ion etching process that etches the insulating layer not covered by the resist mask. But these conventional etching methods have the drawback of forming contact holes substantially narrower from bottom to top. A more thorough explanation of these conventional manufacturing techniques can be found in Japanese Patent Application Publication No. 2003-282571.

INTRODUCTION TO THE INVENTION

One of the shortcomings of using reactive ion etching is that variations in the thickness of the layer to be etched (such as an interlayer insulating layer) may result in some etched holes having a bottom that exposes the preferred underlying layer (such as a titanium nitride layer), while other holes will have bottoms that have yet to reach the preferred underlying layer as a result of the etchant not yet reaching this layer. In other words, reactive ion etching typically etches at a uniform rate and when the thickness of the layer being etched is not uniform, problems can occur as some holes are deep enough to expose the preferred underlying layer, while other holes are not yet deep enough to expose the underlying layer. In circumstances where the etched hole depth does not extend to the preferred underlying layer, subsequent formation of a conductive plug within the hole will be ineffective to establish electrical communication with the underlying layer, which may comprise a barrier layer (TiN) and a wiring layer (Al). To overcome the potential for incomplete reactive ion etching that exposes the preferred underlying layer in each hole, it has been the practice of the industry to continue the reactive ion etching process and sacrifice some of the underlying layer. But such a solution, to sacrifice the underlying layer, also creates the problem of conductive contacts (and conductive plugs) having differing resistances across the device. It has been found that the conductive plugs formed within the semiconductor device in accordance with prior art techniques will vary in resistance, which may result in instability the semiconductor device.

Figure 6A:
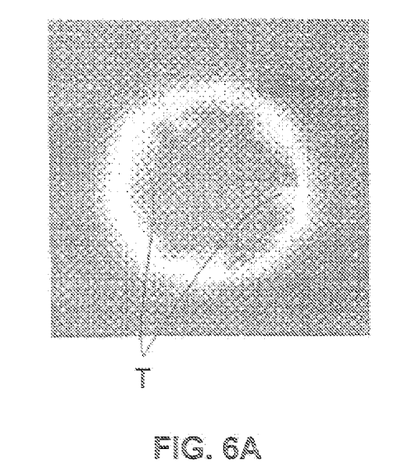
FIG. 6A is an overhead picture taken by a scanning electron microscope showing a prior art through hole formed by reactive ion etching.
Figure 6B:
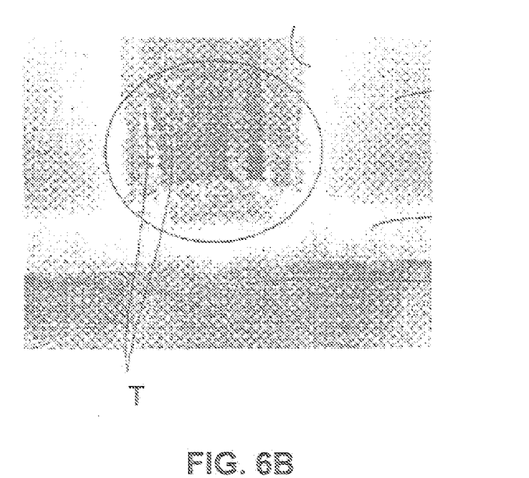
FIG. 6B is a cross-sectional picture taken by a scanning electron microscope showing the through hole of FIG. 6B.

The present inventor has discovered that the diameters at the bottom of through holes formed using the typical reactive ion etching processes are different from each other across the same semiconductor wafer. FIGS. 6A and 6B show scanning electron microscope photographs of a through hole having a bottom diameter on the order of 180 nanometers. As can be seen from FIGS. 6A and 6B, a plurality of minute projections, labeled as "T" in the figures, are formed at the bottom of the through hole (the portion surrounded by a circle indicated in FIG. 6B). As shown in FIG. 6A, the circular shape (taken from an axial cross-section) of the through hole is distorted by the projections T, thereby reducing the diameter at the bottom of the through hole. Accordingly, this decreased bottom diameter results in a correspondingly decreased diameter of a conductive plug that will ultimately fill the through hole. The decreased diameter of the conductive plug, from top to bottom, is theorized to create increased electrical resistance through the conductive plug.

It is believed that the reason why the projections T are formed at the bottom of the through hole is that the layer directly below the insulating layer, for purpose of explanation only is titanium nitride, sublimes during etching. But after the etching process is carried out, the vaporized titanium nitride condenses and solidifies on the lateral sides at the bottom of the contact hole as the semiconductor substrate and the corresponding layers on top of the semiconductor substrate are cooled.

For example, the diameter at the top of a through hole might have a diameter on the order of 210 to 220 nanometers. Accordingly, the bottom diameter should be very similar to that at the top of the through hole, on the order of 210 to 220 nanometers. But, as shown in FIGS. 6A and 6B, the minute projections T at the bottom of the through hole constrict the diameter to be on the order of 180 nanometers.

To address the above problem, the present invention reduces, or prevents altogether, the formation of minute projections at the bottom of the through hole. Thus, the dimensions at the bottom of the through hole more closely resemble the dimensions at the top of the through hole. To reduce or prevent the formation of minute projections at the bottom of the through hole, the temperature of the semiconductor wafer/substrate is raised subsequent to etching so that the sublimed titanium nitride does not condense at the bottom of the contact hole to form the projections T.

According to one aspect of the invention, there is provided a method of manufacturing a semiconductor device that includes a process of forming a through hole reaching a metal nitride layer residing beneath an interlayer insulating layer, the through hole forming process including: a first etching step of etching the interlayer insulating layer by an anisotropic etching method with the semiconductor wafer set to a first temperature; and a second etching step of etching an upper surface of metal nitride layer by an anisotropic etching method with the semiconductor wafer set to a second temperature higher than the first temperature. Following these steps, it is possible to reduce or prevent projections from being formed at the bottom of the through hole by setting the temperature of the semiconductor wafer to be higher in the second etching step. Accordingly, it is possible to form conductive plugs in the through holes having less variance in electrical resistance, which may contribute to stabilization the semiconductor devices.

It is a first aspect of the present invention to provide a method of manufacturing a semiconductor device comprising: (a) forming a hole through an insulating layer to expose a barrier layer at least partially covering a wiring layer formed over a semiconductor wafer, wherein the formation of the hole includes: (i) a first etching step comprising anisotropic etching of the insulating layer at a first temperature; and (ii) a second etching step comprising anisotropic etching of an upper surface of the barrier layer at a second temperature higher than the first temperature.

In a more detailed embodiment of the first aspect, the first etching step exposes the upper surface of the barrier layer. In yet another more detailed embodiment, the barrier layer comprises titanium nitride. In a further detailed embodiment, the first temperature is set by setting a temperature of a heating plate in thermal communication with the semiconductor wafer to be less than 40° C., and the second temperature is set by setting the temperature of the heating plate to be more than 50° C. In still a further detailed embodiment, the first etching step includes setting an erupting pressure of an inert gas to cool an outer circumference of the semiconductor wafer to be at least 40 Torr, and the second etching step includes setting the erupting pressure of the inert gas at no more than 30 Torr.

DETAILED DESCRIPTION

The exemplary embodiments of the present invention are described and illustrated below to encompass methods of manufacturing semiconductor devices, as well as the resulting semiconductor devices themselves. Of course, it will be apparent to those of ordinary skill in the art that the embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
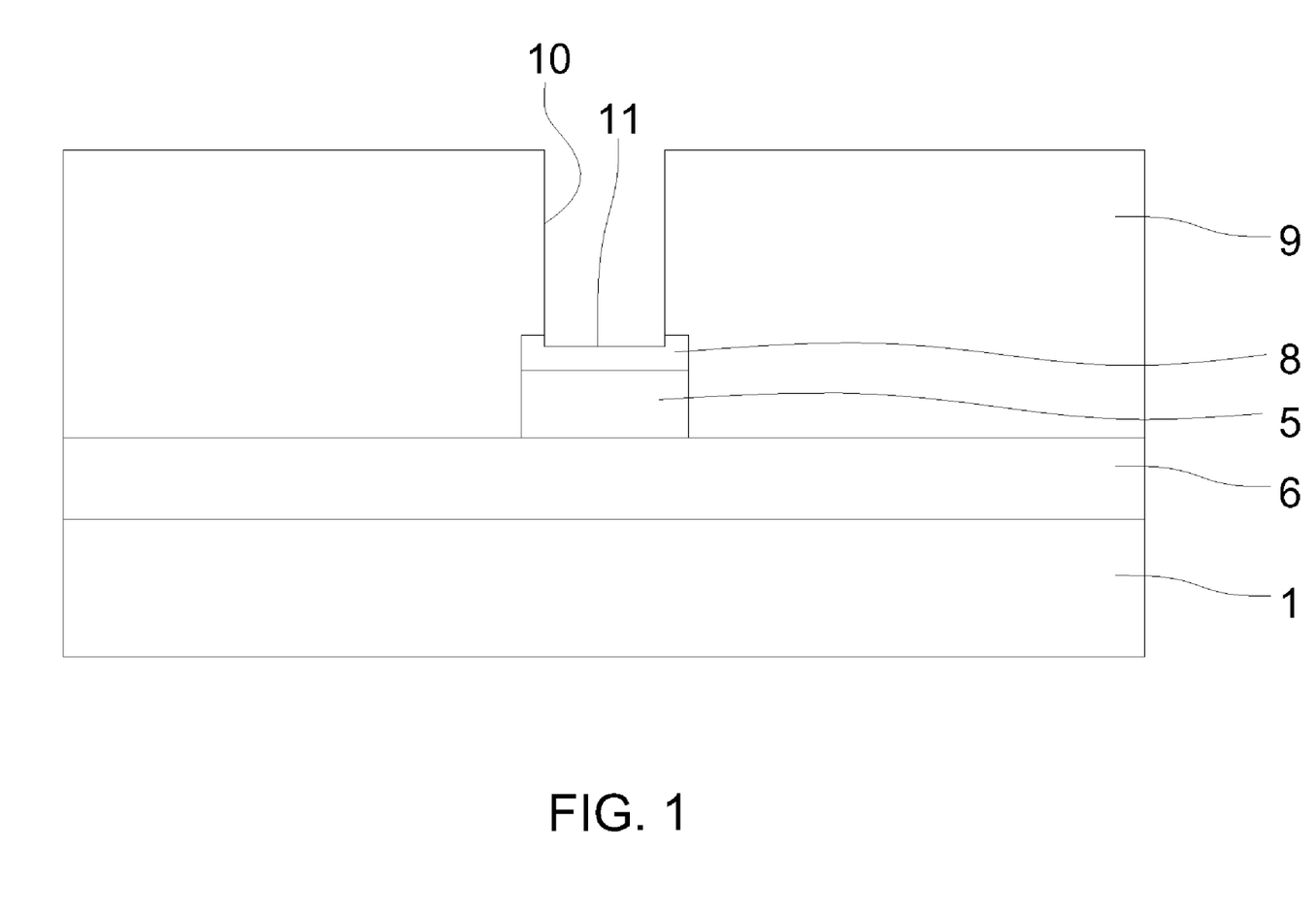
FIG. 1 is a cross-sectional representation of a through hole within a semiconductor device according to an exemplary process in accordance with the instant invention.
Figure 2:
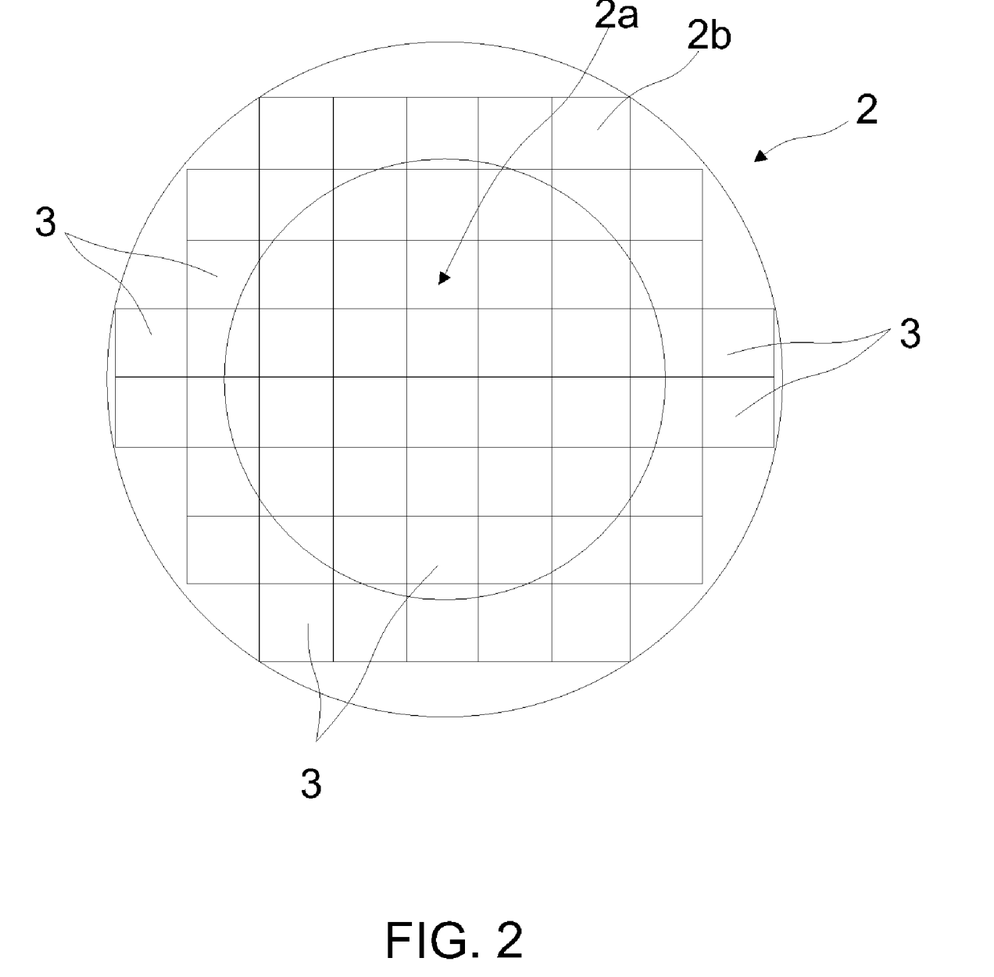
FIG. 2 is an overhead view of a semiconductor wafer with a plurality of rectangular semiconductor devices.

Referring to FIGS. 1 and 2, reference numeral 1 denotes a silicon semiconductor substrate of a semiconductor wafer 2. A plurality of semiconductor elements constituting a semiconductor device 3 are formed on the semiconductor substrate 1. Reference numeral 5 denotes a wiring layer that may be formed by patterning a conductive layer using photolithography. The wiring layer 5 may be fabricated from a conductive material such as, without limitation, aluminum (Al), tungsten (W) or other conductive materials using deposition technique that include sputtering and chemical vapor deposition (CVD). The wiring layer 5 may be formed on an insulating layer 6 that may be fabricated by depositing an insulating material such as, without limitation, silicon dioxide ($SiO_2$) on the semiconductor substrate 1 by CVD or other known methods. The wiring layer 5 in exemplary form is electrically connected to certain doped regions (not shown) within the semiconductor substrate 1 by way of contact plugs (not shown).

Reference numeral 8 denotes a titanium nitride layer, which may be formed by laminating titanium nitride (TiN) on the wiring layer 5 using a sputtering method or other known technique. The titanium nitride layer 8 acts as an oxidation barrier to prevent the wiring layer 5 from being oxidized. Reference numeral 9 denotes an interlayer insulating layer which is formed by depositing a relatively thick layer of an insulating material such as, without limitation, silicon dioxide to cover the insulating layer 6, the wiring layer 5, and the titanium nitride layer 8. The interlayer insulating layer 9 may be formed using CVD, but it should be understood that other techniques known to those skilled in the art could likewise be employed to form the interlayer insulating layer 9. The interlayer insulating layer 9 has a final thickness of approximately 6600 Å. Reference numeral 10 denotes a through hole reaching the titanium nitride layer 8 from the top of the interlayer insulating layer 9. As shown in FIG. 1, the through hole 10 is formed by burrowing through the interlayer insulating layer 9 and burrowing into a portion of the titanium nitride layer 8 to form a concave portion 11 on an upper surface of the titanium nitride layer 8. After forming the through hole 10, a conductive plug (not shown) is formed in the hole by filling the hole 10 with conductive material such as, without limitation, aluminum, tungsten, or other conductive materials by known deposition technique including, but not limited to, sputtering and CVD.

Figure 3A:
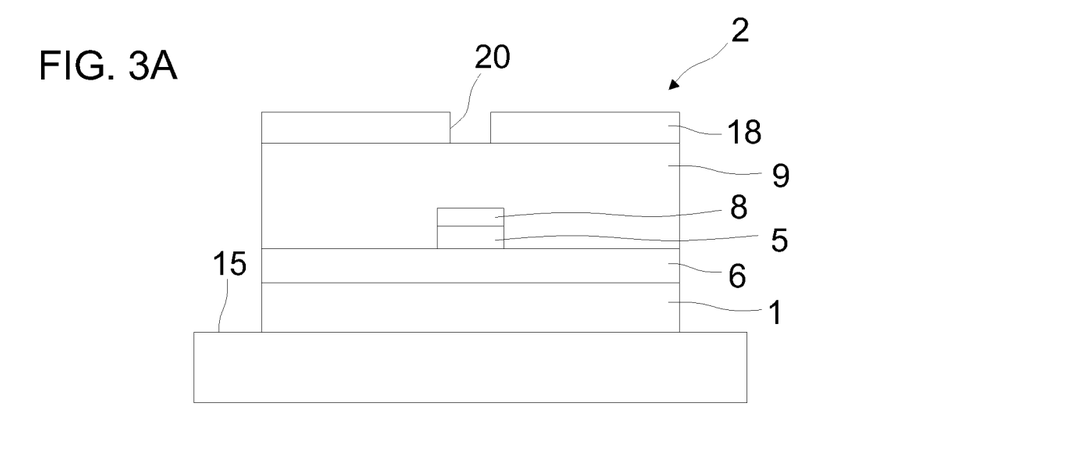
FIG. 3A is a cross-sectional representation of a semiconductor device prior to forming a through hole in accordance with the instant invention.
Figure 3B:
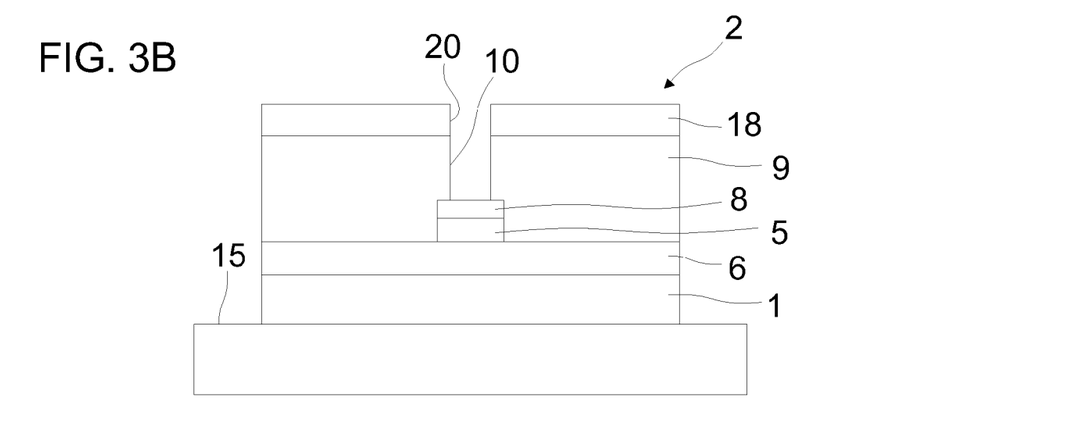
FIG. 3B is a cross-sectional representation of the semiconductor device of FIG. 3A after forming a first potion of the through hole.
Figure 3C:
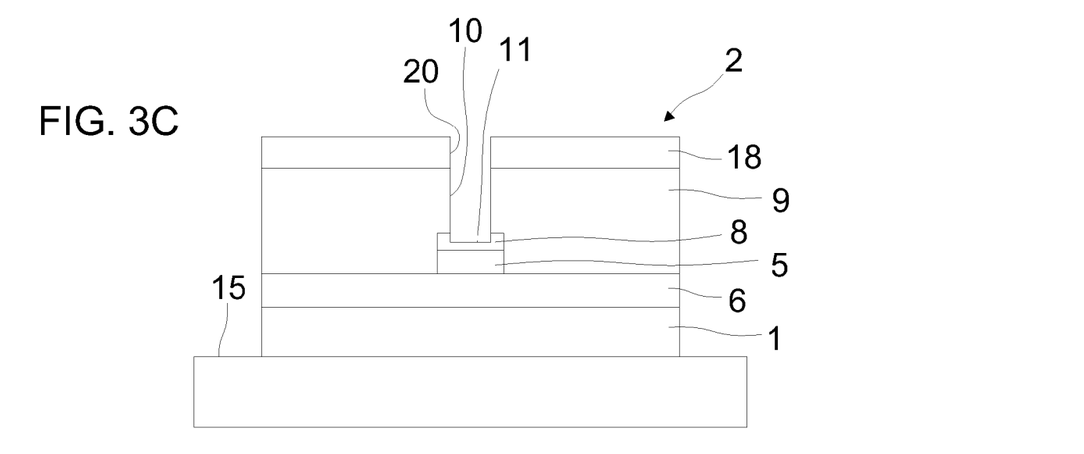
FIG. 3C is a cross-sectional representation of the semiconductor device of FIG. 3B after forming a second potion of the through hole.

Referring to FIGS. 3A-3C, reference numeral 15 denotes a heating plate that is incorporated in a mount to secure the semiconductor wafer 2 to an etching device. The heating plate 15 is operative to heat the semiconductor wafer 2 from its lower side. Reference numeral 18 denotes a resist mask comprising a mask pattern formed by exposing and developing a positive or negative resist using photolithography. The resist may be applied to the semiconductor wafer 2 by a spin coating method or other known method. As will be discussed in more detail below, the resist mask 18 acts as a mask in an etching process.

Referencing FIG. 3A, a plurality of semiconductor elements are formed on the semiconductor substrate 1. These elements include an insulating layer 6 formed on the semiconductor wafer 2 having scribe lines set for when the semiconductor device 3 (see FIG. 2) is segmented. The semiconductor elements also include a wiring layer 5, formed on top of the insulating layer 6, electrically connected to a certain elements within the semiconductor substrate 1. As discussed previously, the wiring layer 5 is connected to contact plugs (not shown) extending through the insulating layer 6 and into contact with doped regions (not shown) that are formed within the semiconductor substrate 1. A titanium nitride layer 8 is formed over the wiring layer 5, followed by a 15000 Å silicon dioxide deposition by CVD. This silicon dioxide layer is subjected to a chemically mechanically polishing (CMP) process to planarize the layer and reduce its thickness to approximately 6600 Å to arrive at the interlayer insulating layer 9.

After the CMP process is carried out, a resist mask 18 is formed over the interlayer insulating layer 9 by first depositing a resist using a spin deposition method, followed by photolithography (whether positive or negative) to form openings 20 through the resist 18 to expose the insulating layer 9. In exemplary form, the holes 20 of the resist mask 18 each have a diameter of approximately 220 nanometers and are oriented to overlap at least a portion of the titanium nitride layer 8 formed on the wiring layer 5.

Referring to FIG. 3B, an anisotropic etching process is carried out to form holes 10 that extend beyond the openings in the resist mask 18 and through the interlayer insulating layer 9. This anisotropic etching process is carried out using a magnetron reactive ion etching (RIE) dry etching device. The conditions under which the magnetron RIE device was operated were an atmosphere pressure of 40 milliTorr, a bias power of 1700 watts, a heating plate 15 temperature of 40° C., a cooled helium (He) erupting pressure at the central portion 2a of the semiconductor wafer 2 of 7 Torr, and a cooled He erupting pressure at the outer circumference 2b of the wafer of 40 Torr. It should also be noted that the mixture of gas used as the RIE etchant comprised $C_4F_8$@20 sccm, $O_2$@8 sccm, and Ar@500 sccm.

Referencing FIG. 3C, after the titanium nitride layer 8 is exposed pursuant to the first etching step, the temperature of the heating plate 15 and the cooled He erupting pressure to the semiconductor wafer 2 are changed to carry out a second anisotropic etch, resulting in the formation of the concave portion 11 of the titanium nitride layer 8. In exemplary form, the maximum depth of the concave portion 11 is approximately 20 nanometers. The second anisotropic etch is performed under conditions of an atmosphere pressure of 40 millitorr, a bias power of 1700 watts, a heating plate 15 temperature of 50° C., a cooled helium (He) erupting pressure at the central portion 2a of the semiconductor wafer 2 of 5 Torr, and a cooled He erupting pressure at the outer circumference 2b of 10 Torr. Likewise, the same etchant gas is used at the same flowrates for this second etch: $C_4F_8$@20 sccm, $O_2$@8 sccm, and Ar@500 sccm. After the second etch, the resist mask 18 is removed, followed by formation of a conductive plug (not shown) within each hole 10 using a known deposition technique such as, without limitation, CVD and sputtering. Electrode pads (not shown) are formed to be in electrical communication with the conductive plugs, followed by division of the semiconductor wafer 2 into segments to produce semiconductor devices 3.

Figure 4A:
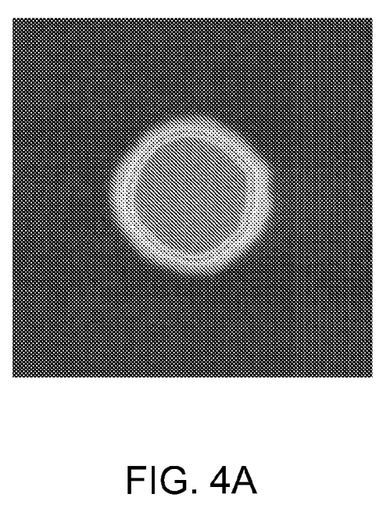
FIG. 4A is an overhead picture taken by a scanning electron microscope showing a through hole formed in accordance with the instant invention.
Figure 4B:
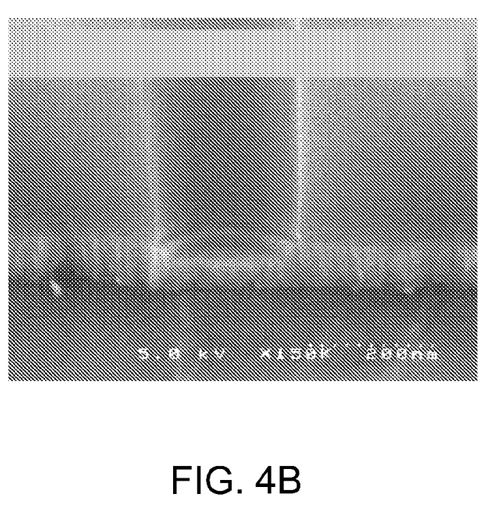
FIG. 4B is a cross-sectional picture taken by a scanning electron microscope showing the through hole of FIG. 4A.

Referring to FIGS. 4A and 4B, scanning electron microscope photographs were taken of a through hole 10 formed in accordance with the exemplary method of the present invention. As evidenced by the photographs, the through hole has a substantially circular shape along its entire length and exhibits no noticeable projections at the bottom of the hole 10.

Figure 5:
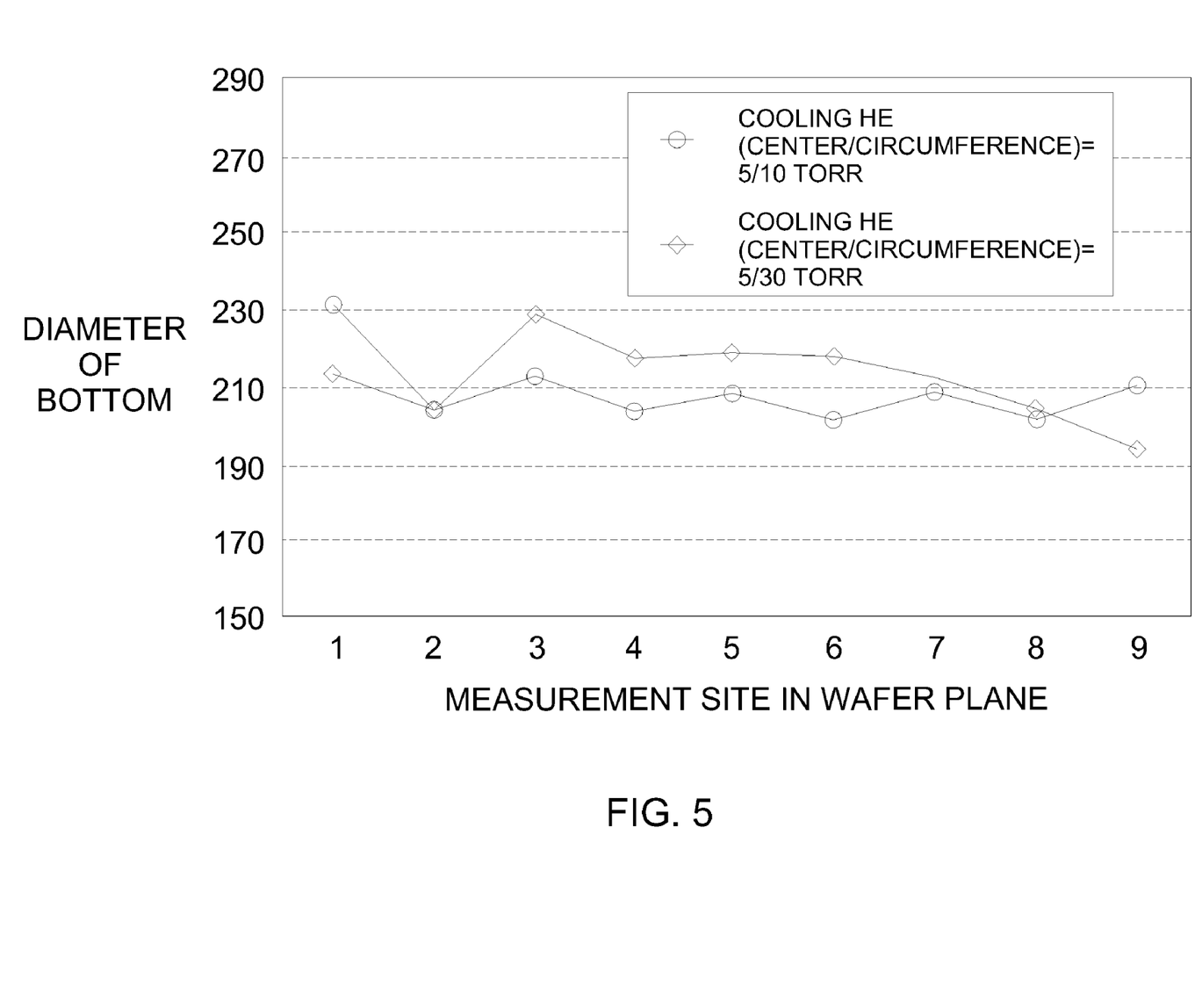
FIG. 5 is a plot showing a distribution of through hole bottom diameters as a function of position for holes formed in accordance with the instant invention.

Referencing FIG. 5, a plot shows a distribution of measured diameters at the bottom of a plurality of through holes 10 distributed across the semiconductor wafer 2 that were formed in accordance with the instant invention. Each data point is indicated by either a "θ" or "◇", differentiated by the fact that "θ" data points correspond to a cooled helium (He) erupting pressure at the central portion 2a of the semiconductor wafer 2 of 5 Torr and a cooled He erupting pressure at the outer circumference 2b of 10 Torr, while "◇" data points correspond to a cooled helium (He) erupting pressure at the central portion 2a of the semiconductor wafer 2 of 5 Torr and a cooled He erupting pressure at the outer circumference 2b of 30 Torr. Each data set corresponds to the conditions present during the second etching step. This data reflects that holes 10 formed in accordance with the present invention have bottom diameters substantially larger than those formed by prior art techniques (i.e., 180 nanometers) for hole diameters at the top between 210 and 220 nanometers.

According to the above results, it is preferable that the cooled He erupting pressure at the outer circumference 2b in the first etching process is set to be more than 40 Torr and the cooled He erupting pressure at the outer circumference 2b of the semiconductor wafer 2 in the second etching process is set to be less than 30 Torr. If the cooled He erupting pressure at the outer circumference 2b in the first etching process is less than 40 Torr, the temperature of the semiconductor wafer 2 may become so high as to enlarge the diameter of the through hole 10 formed in the interlayer insulating layer 9. In addition, if the cooled He erupting pressure at the outer circumference 2b in the second etching process is more than 30 Torr, the temperature of the semiconductor wafer 2 when the titanium nitride layer 8 is etched may become so low that the sublimed titanium nitride adheres to the bottom of the through hole 10. This conclusion is supported by the fact that the diameter at the bottom of the through hole 10, as indicated by "◇" in FIG. 5, stabilized in the range of 210 to 220 nm when the cooled He erupting pressure at the outer circumference 2b is set to be 30 Torr. In addition, it is preferable that the temperature of the heating plate 15 installed below the semiconductor wafer 2 is less than 40° C. in the first etching step and more than 50° C. in the second etching step.

If the set temperature of the heating plate 15 is more than 40° C. in the first etching step, the diameter of the through hole 10 formed in the interlayer insulating layer 9 may be enlarged. In addition, if the set temperature of the heating plate 15 is less than 50° C. in the second etching step, the titanium nitride sublimed when the titanium nitride layer 8 is etched may adhere to the bottom of the through hole 10.

As described above, since the titanium nitride layer 8 is etched during formation of the through hole 10 using an increased temperature of the semiconductor substrate 1, it is possible to prevent the projections T seen in FIGS. 6A and 6B from being formed at the bottom of the through hole 10, while at the same time suppressing enlargement of the diameter of the through hole 10 within the interlayer insulating layer 9. Accordingly, it is possible to prevent wide variations of resistance in the conductive plugs (not shown) formed when filling the holes 10 with a conductive material as the diameter at the bottom of the holes across the substrate 1 are substantially uniform and approximate the diameters at the top of the holes 10.

The present inventor also obtained a distribution of diameters at the bottom of through holes 10 formed in accordance with the instant invention as a function of temperature distribution within the semiconductor wafer 2 while etching the through holes 10. While this data has not been reproduced in the instant application, the data indicated that through holes 10 formed in the central portion 2a of the semiconductor wafer 2 (see FIG. 2) had a higher incidence of wider diameters than through holes formed at the outer circumference 2b of the semiconductor wafer 2. This is theorized to occur as the heating of the semiconductor wafer 2 is concentrated at the central portion 2a. To address this distribution of contact hole sizes, the entire semiconductor wafer 2 should be uniformly heated or heating can occur to selected portions of the wafer, presuming sufficient time is provided to allow the wafer to reach a substantially uniform temperature.

In addition, although it has been described and illustrated in the exemplary figures that the through holes 10 are formed to contact a first level titanium nitride layer over a first level wiring layer, the present invention is similarly applicable to forming through holes in any insulating layer, regardless as to the level of the insulating layer. For example, a through hole using the exemplary techniques of the instant invention may be formed to contact a second level titanium nitride layer (not shown) overlapping a second level wiring layer (not shown). In other words, the present invention is applicable to the formation of any hole where sublimed materials could condense at the bottom of the hole, regardless of what layer the hole is formed in above the semiconductor substrate 1.

Moreover, although it has been described and illustrated in the exemplary figures that the bulk substrate comprises a silicon semiconductor wafer, it is also within the scope of the invention to use a silicon-on-insulator (SOI), a silicon on sapphire (SOS), or a silicon on quartz (SOQ) substrate as the bulk substrate 1.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A method of manufacturing a semiconductor device comprising:
    forming a hole through an insulating layer to expose a conductive barrier layer at least partially covering a wiring layer formed over a semiconductor wafer, wherein the formation of the hole includes:
    a first etching step comprising anisotropic etching of the insulating layer at a first temperature; and
    a second etching step comprising anisotropic etching of an upper surface of the conductive barrier layer at a second temperature higher than the first temperature.

2. The method according to claim 1,
    wherein the first etching step exposes the upper surface of the conductive barrier layer.

3. The method according to claim 1,
    wherein the conductive barrier layer comprises titanium nitride.

4. The method according to claim 2,
    wherein the conductive barrier layer comprises titanium nitride.

5. The method according to claim 1,
    wherein the first temperature is set by setting a temperature of a heating plate in thermal communication with the semiconductor wafer to be less than 40° C.; and
    wherein the second temperature is set by setting the temperature of the heating plate to be more than 50° C.

6. The method according to claim 2,
    wherein the first temperature is set by setting a temperature of a heating plate in thermal communication with the semiconductor wafer to be less than 40° C.; and
    wherein the second temperature is set by setting the temperature of the heating plate to be more than 50° C.

7. The method according to claim 3,
    wherein the first temperature is set by setting a temperature of a heating plate in thermal communication with the semiconductor wafer to be less than 40° C.; and
    wherein the second temperature is set by setting the temperature of the heating plate to be more than 50° C.

8. The method according to claim 1,
    wherein the first etching step includes setting an erupting pressure of an inert gas to cool an outer circumference of the semiconductor wafer to be at least 40 Torr; and
    wherein the second etching step includes setting the erupting pressure of the inert gas at no more than 30 Torr.

9. The method according to claim 2,
    wherein the first etching step includes setting an erupting pressure of an inert gas to cool an outer circumference of the semiconductor wafer to be at least 40 Torr; and
    wherein the second etching step includes setting the erupting pressure of the inert gas at no more than 30 Torr.

10. The method according to claim 3,
    wherein the first etching step includes setting an erupting pressure of an inert gas to cool an outer circumference of the semiconductor wafer to be at least 40 Torr; and
    wherein the second etching step includes setting the erupting pressure of the inert gas at no more than 30 Torr.

11. The method according to claim 5,
    wherein the first etching step includes setting an erupting pressure of an inert gas to cool an outer circumference of the semiconductor wafer to be at least 40 Torr; and
    wherein the second etching step includes setting the erupting pressure of the inert gas at no more than 30 Torr.

* * * * *